US008970313B2

(12) United States Patent
Morris (10) Patent No.: US 8,970,313 B2
(45) Date of Patent: Mar. 3, 2015

(54) AREA EFFICIENT SINGLE CAPACITOR CMOS RELAXATION OSCILLATOR

(71) Applicant: Dialog Semiconductor GmbH, Kirchheim/Teck-Nabern (DE)

(72) Inventor: Tim Morris, Lorrach (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 132 days.

(21) Appl. No.: 13/644,490

(22) Filed: Oct. 4, 2012

(65) Prior Publication Data

US 2014/0091870 A1 Apr. 3, 2014

(30) Foreign Application Priority Data

Oct. 2, 2012 (EP) .................................... 12368029

(51) Int. Cl.
*H03K 3/0231* (2006.01)
*H03K 3/354* (2006.01)
(52) U.S. Cl.
CPC .............. *H03K 3/0231* (2013.01); *H03K 3/354* (2013.01)
USPC .......................................... 331/111; 331/143
(58) Field of Classification Search
CPC ................ H03K 3/0231; H03K 3/354; H03K 4/50–4/502
USPC .................................. 331/111, 143
See application file for complete search history.

(56) References Cited

U.S. PATENT DOCUMENTS

| 3,702,446 | A | * | 11/1972 | Steudel | ........................ | 331/111 |
| 4,623,851 | A | * | 11/1986 | Abou | ........................... | 331/111 |
| 4,904,960 | A | | 2/1990 | Izadinia et al. | | |
| 5,497,127 | A | | 3/1996 | Sauer | | |
| 5,654,677 | A | | 8/1997 | Dent | | |
| 6,137,373 | A | * | 10/2000 | Mori | ............................ | 331/145 |
| 6,720,836 | B2 | | 4/2004 | Lin | | |
| 7,135,937 | B2 | | 11/2006 | Mitsuda | | |
| 7,310,025 | B2 | | 12/2007 | Mitsuda | | |
| 8,565,705 | B2 | * | 10/2013 | Kousai | .......................... | 455/255 |
| 2007/0170516 | A1 | | 7/2007 | Cecchi et al. | | |
| 2008/0204155 | A1 | | 8/2008 | Olmos et al. | | |
| 2011/0274295 | A1 | | 11/2011 | Motoki | | |

FOREIGN PATENT DOCUMENTS

DE  10158113  6/2003
EP  0 180 084  5/1986

OTHER PUBLICATIONS

Wens et al., "Design and Implementation of Fully-Integrated Inductive DC-DC Converters in Standard CMOS", May 10, 2011, Springer, ISBN 978-94-007-1436-6, pp. 213-220.*
European Seach Report 12368029.0-1810 Mail Date—Apr. 5, 2013, Dialog Semiconductor GmbH.

* cited by examiner

*Primary Examiner* — Ryan Johnson
(74) *Attorney, Agent, or Firm* — Saile Ackerman LLC; Stephen B. Ackerman (57) ABSTRACT

Methods and circuits for CMOS relaxation oscillators are disclosed. A single capacitive element, a single current source and a switching network are utilized. A switching network of the oscillator allows both nodes of the capacitive element to rise and fall between a positive and a negative voltage with respect to ground supply, without causing leakage to substrate or risk of latch-up, i.e. the inadvertent creation of a low-impedance path. The oscillator requires minimum silicon area, has an improved duty cycle, is particular useful for implementing lower frequency clocks and is enabled for smaller technology nodes, lower than 250 nm, due to lower supply voltage.

24 Claims, 6 Drawing Sheets

AREA EFFICIENT SINGLE CAPACITOR CMOS RELAXATION OSCILLATOR

BACKGROUND (1) Field of the Disclosure

This invention relates generally to the field of electronic circuits and relates in particular to relaxation oscillators.

(2) Description of the Background

A relaxation oscillator is an oscillator based upon the behavior of a physical system's return to equilibrium after being disturbed. That is, a dynamical system within the oscillator continuously dissipates its internal energy. Normally the system would return to its natural equilibrium; however, each time the system reaches some threshold sufficiently close to its equilibrium, a mechanism disturbs it with additional energy. Hence, the oscillator's behavior is characterized by long periods of dissipation followed by short impulses. The period of the oscillations is set by the time it takes for the system to relax from each disturbed state to the threshold that triggers the next disturbance.

It is a challenge for designers of CMOS relaxation oscillators to design circuits, which require minimal chip area, a reliable duty cycle, and a low minimum frequency.

SUMMARY

A principal object of the present invention is to achieve a relaxation oscillator requiring minimum chip-area.

A further object of the present invention is to achieve a reliable duty-cycle of the oscillator.

A further object of the present invention is that the switching network of the oscillator does not cause leakage to substrate or a risk of latch-up, i.e. the inadvertent creation of a low-impedance path.

In accordance with the objects of this disclosure a method to achieve CMOS oscillators requiring minimal silicon area and enabled to operate at low frequencies and for small technology nodes have been disclosed. The method disclosed comprises, firstly, the steps of: (1) providing a relaxation oscillator comprising only one capacitive element, a comparator, a logic circuitry, four switching means, connected between a reference voltage and a virtual ground voltage, (2) implementing a CMOS switching network allowing nodes at a first and a second terminal of the capacitive element to rise and fall between positive and negative potentials with respect to ground supply, without causing leakage to substrate or risk of latch-up, and (3) starting a first of two symmetrical phases wherein a node at a first terminal of the capacitive element is switched to the virtual ground voltage and a node at a second terminal of the capacitive element is charged to the reference voltage. Furthermore the method disclosed comprises: (4) starting a second of the two symmetrical phases when the node at the second terminal of the capacitive element reaches a potential with respect to the virtual ground voltage equal to the reference voltage, wherein in the second phase the node at the second terminal is switched to the virtual ground voltage and the node at the first terminal of the capacitive element is charged up to a potential with respect to the virtual ground voltage equal of the reference voltage; and (5) going back to step (3) when the node of the first terminal reaches the reference voltage with respect to the virtual ground and repeat a cycle of the first and the second phases.

In accordance with the objects of this disclosure a CMOS relaxation oscillator requiring minimal silicon area and enabled to operate at low frequencies and for small technology nodes below 250 nm has been achieved. The oscillator disclosed firstly comprises: one capacitive element only, one current source only wherein a first terminal is connected to VDD voltage and a second terminal is connected to a switching network, and a threshold detection unit to determine when a node of the capacitive element exceeds a given threshold voltage. Furthermore the oscillator comprises a logic circuitry triggered by the voltage threshold detector to swap between two operation phases, and the switching network to alternate between two phases of operation comprising a number of CMOS switches, wherein the switching network is configured to operate the oscillator in the two phases, where in a first phase a node at a first terminal of the capacitive element is switched to a virtual ground voltage and a node at a second terminal of the capacitive element is charged to a reference voltage, and in a second phase, when the node at the second terminal of the capacitive element reaches a potential with respect to the virtual ground voltage equal to the reference voltage, the node at the second terminal is switched to the virtual ground voltage and the node at the first terminal of the capacitive element is charged up to a potential with respect to the virtual ground voltage equal of the reference voltage.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present disclosure teaches methods and circuits to achieve CMOS relaxation oscillators requiring minimal chip space and provide a reliable duty cycle.

Figure 1:
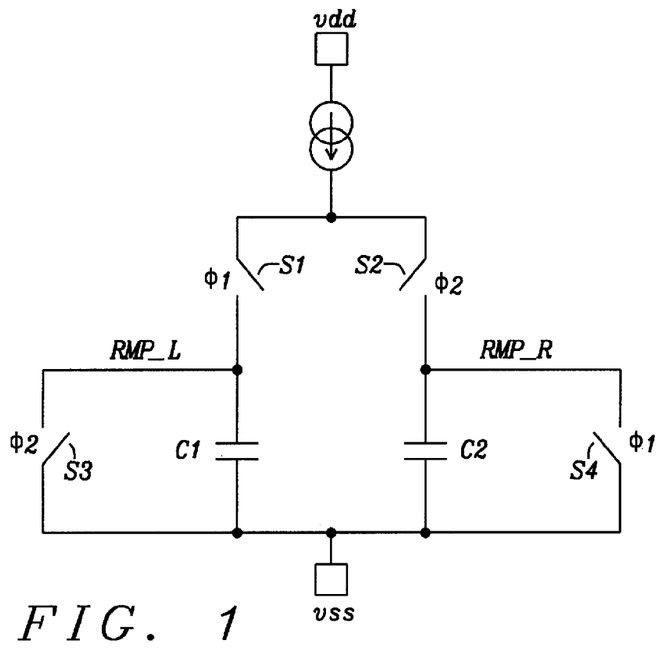
FIG. 1 shows a basic diagram of a relaxation oscillator (comparator and logic not shown).

FIG. 1 shows a first embodiment of a relaxation oscillator in CMOS technology utilizing 2 capacitive elements C1 and C2, which are charged and discharged in alternating phases. The oscillator half-period is defined by the time taken to charge a first capacitive element from its discharged state (Q=0) to its charged state (Q=CV). The voltage across the capacitive element in the charged state is equal to some reference voltage which is typically bounded by the positive voltage supply for the circuit. The voltage across the capacitive element in the discharged state is typically zero.

A network of switches S1-S4 support the oscillation of the circuit shown in FIG. 1, Switches S1 and S4 close in phase φ1, Switches S2 and S3 close in phase φ2. A current source 1 provides the power to charge the capacitors periodically.

The disadvantages of the circuit of FIG. 1 include, but are not limited to, the following:

Only one capacitor is utilized per half-period, the other serves no useful purpose and therefore represents an inefficient use of area.

The duty-cycle is affected by any capacitor mismatch.

The minimum oscillator frequency is bounded by the maximum capacitor size (area constraint), minimum charging current (performance/reliability), and maximum supply voltage (limited by technology and system):

The frequency of the oscillator follows the equations f=I/ (C×V), wherein I is charging current from the current source 1, C is the total capacitance of both capacitors, and V is the voltage at which the capacitor is considered as fully charged.

Clearly lower frequency requires lower current, larger capacitance, and/or higher voltage.

Figure 2:
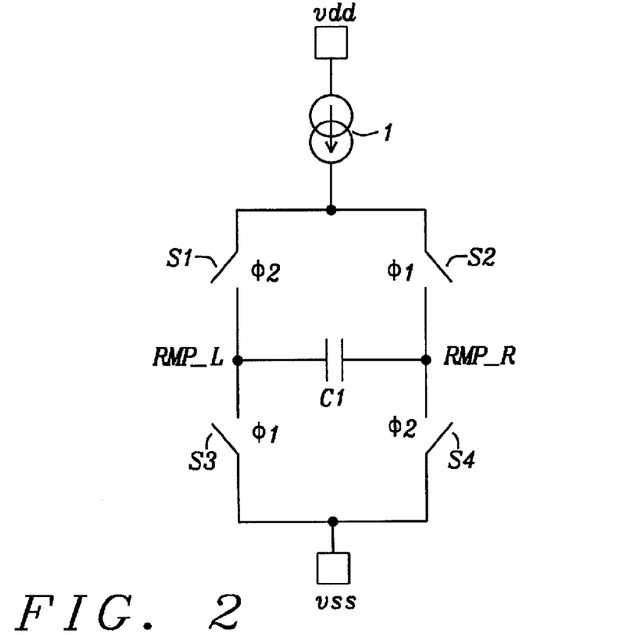
FIG. 2 illustrates a basic diagram of an improved relaxation oscillator (comparator and logic not shown) configured to enable low frequency clocks and smaller technology (<250 nm) due to lower supply voltage.

FIG. 2 shows an improved embodiment of the present disclosure overcoming the drawbacks outlined above. The circuit of FIG. 2 is configured to enable low frequency clocks and smaller technology nodes (<250 nm) due to lower supply voltage.

The oscillator of FIG. 2 converts a constant or programmable current source 1 and a constant or programmable voltage reference into a fixed or programmable clock frequency. The oscillator utilizes the current source 1, a single capacitive element C1 and four switching elements S1-S4 to sequentially charge both ends of the capacitor up to the level of the voltage reference. The switching elements could be implemented by e.g. transistors.

The comparator (which is used to detect when one of the sides of the capacitor has reached the reference) is usually supplied by VDD also, which means that the preferred reference will be lower than VDD, because some headroom is required for the current source 1. The reference voltage is usually derived from a bandgap reference voltage to ensure it stays constant for different temperatures.

For best frequency performance the capacitor is usually formed by parallel metal plates separated by a dielectric layer of very well controlled thickness. An example is when 2 of the metal routing layers are used to form a "MIM-cap" (a Metal-Insulator-Metal capacitor). These capacitors have very good temperature independence, so the frequency can be also independent from temperature by using MIM-caps. In technology nodes of 130 nm and below, the area efficiency of MOM-caps (Metal-Oxide-Metal capacitors) becomes comparable to that of MIM-caps (approximately same capacitance per unit area). Below 130 nm, MOM-caps provide higher capacitance per unit area. MOM-caps also have very good temperature independence, so which one is used would just depend on which provides best area efficiency.

An external capacitor may also be used alternatively but at the expense of (1) extra pins on the chip which are usually limited and (2) extra bill-of-materials and a capacitor uses PCB space, thus creating higher expense.

The oscillator operates in two symmetrical phases, whereby in phase one (φ1,) the RMP_L node of the capacitive element is switched to vss and the RMP_R node is charged up to the reference voltage. When RMP_R reaches a potential with respect to vss equal to the reference voltage a voltage comparator switches and some logic circuitry is triggered to swap the phase to phase two. In phase two (φ2) the RMP_R node of the capacitive element is switched to vss and the RMP_L node is charged up to a potential with respect to vss equal to the reference voltage. When RMP_L reaches the reference voltage a voltage comparator switches and some logic circuitry is triggered to swap the phase to phase one and so the cycle is repeated.

Figure 8:
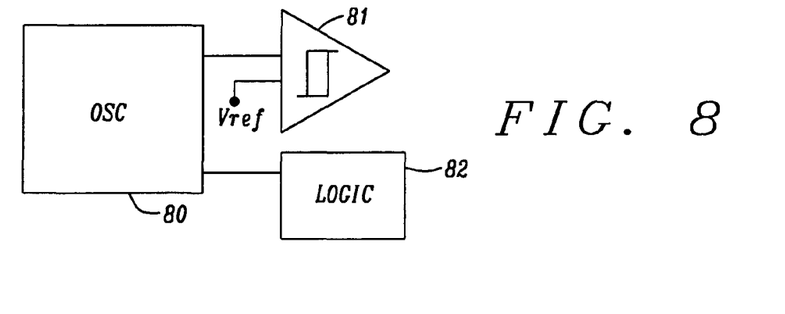
FIG. 8 shows a basic block diagram comprising the oscillator 80, the comparator 81 and the logic circuitry 82 swapping between the phases.

FIG. 8 shows a basic block diagram comprising the oscillator 80, threshold detection circuit 81 as e.g. a comparator, and the logic circuitry 82 swapping between the two phases.

Returning to FIG. 2, at a time immediately before the start of phase one, the potential $(V_{RMP\_L}-V_{RMP\_R})=(V_{reference}-V_{vss})$. At the start of phase one the RMP_L node is switched to vss but the charge stored in the capacitive element C1 remains, therefore the potential $(V_{RMP\_R}-V_{vss})=(V_{VSS}-V_{Reference})$.

During phase one the node RMP_R is charged up relative to Vvss at a rate of $dV/dt=I_{source}/C_{C1}$ (Volts/seconds), wherein $C_{C1}$ is the capacitance of the capacitive element C1.

The RMP_R node must increase to satisfy $(V_{RMP\_R}-V_{vss})=(V_{Reference}-V_{vss})$ in order to trigger the next phase, therefore a voltage delta $dV=2\times(V_{Reference}-V_{vss})$ is required. The charging time for one phase is then $d1=(dV\times C_{C1})/I_{source}$. The oscillator frequency is derived from two symmetrical phases, $f=I_{source}/(4\times C_{C1}\times V_{Reference})$; wherein $V_{vss}$ is assumed=0.

Figure 3:
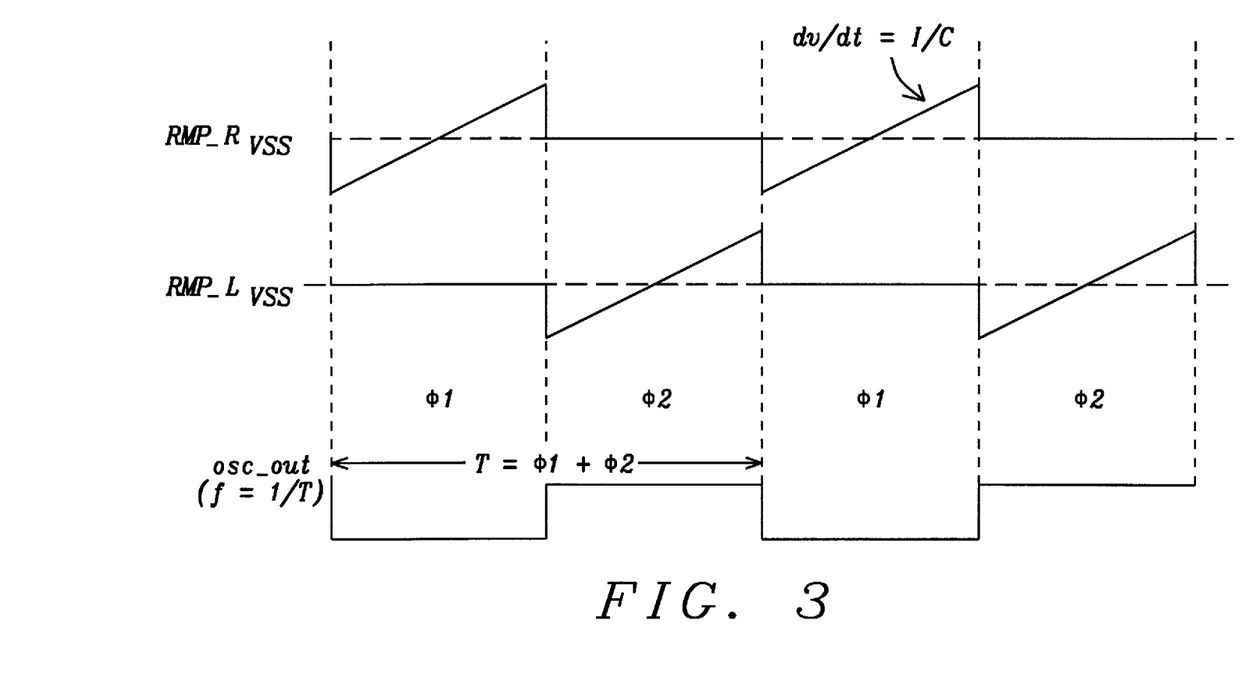
FIG. 3 illustrates the clock generation.

FIG. 3 illustrates the clock generation of the circuit disclosed. It shows how the voltages of the nodes RMP_R and RMP_L periodically rise and fall according a period $T=\phi1+\phi2$, i.e. the frequency of the oscillator is 1/T. The voltages rises with a speed of dv/dt=I/C.

In comparison with the circuit shown in FIG. 1, the new architecture reduces the oscillator frequency by a factor of 4 considering that the same current, total capacitance, and reference voltage are used:

$$f = \frac{I}{4 \times C \times V}$$

wherein I is the charging current, C is the total capacitance of the single capacitive element, e.g. a capacitor, V is the voltage at which the capacitive element is considered to be fully charged.

Clearly the same frequency as obtained by the circuit shown in FIG. 1 can be obtained using the new architecture by using a 4× higher charging current, ¼ capacitor area, or ¼ voltage reference.

Figure 4:
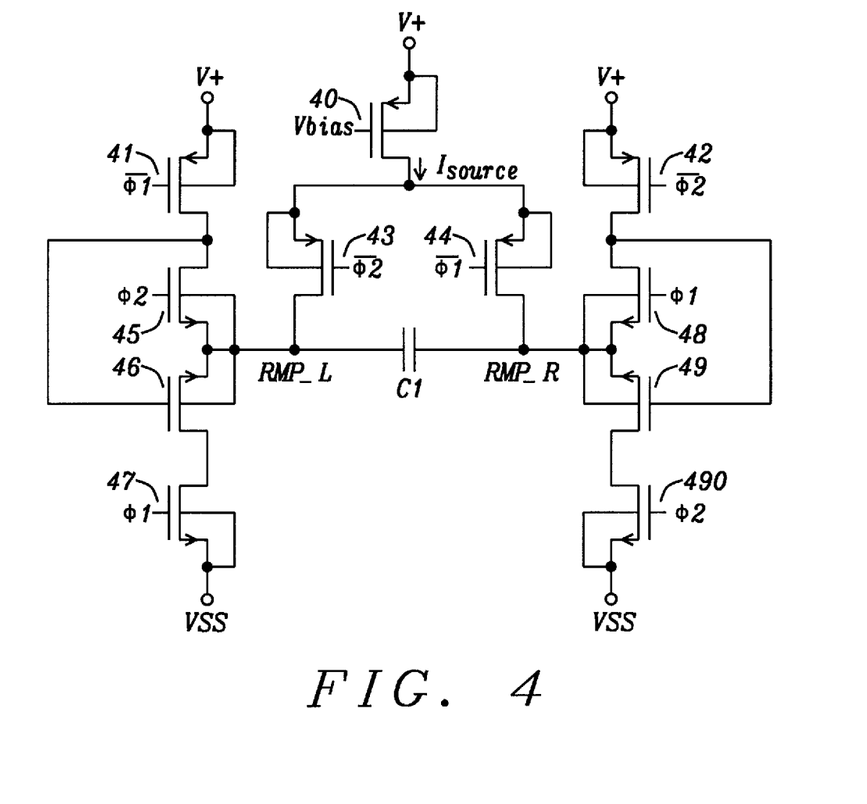
FIG. 4 depicts an example of the switching network disclosed.

Essential to the design of the circuits of FIG. 2 and FIG. 4 disclosed are one current source 40, the switching network (detailed example implementation shown in FIG. 4), and the single capacitive element C1. Also essential to the design is some kind of voltage threshold detector (not shown in FIG. 4) which detects when RMP_L or RMP_R nodes exceed a given threshold voltage with respect to voltage vss, and which then stimulates the switching of the circuit phase (between phases φ1 and φ2).

Figure 5:
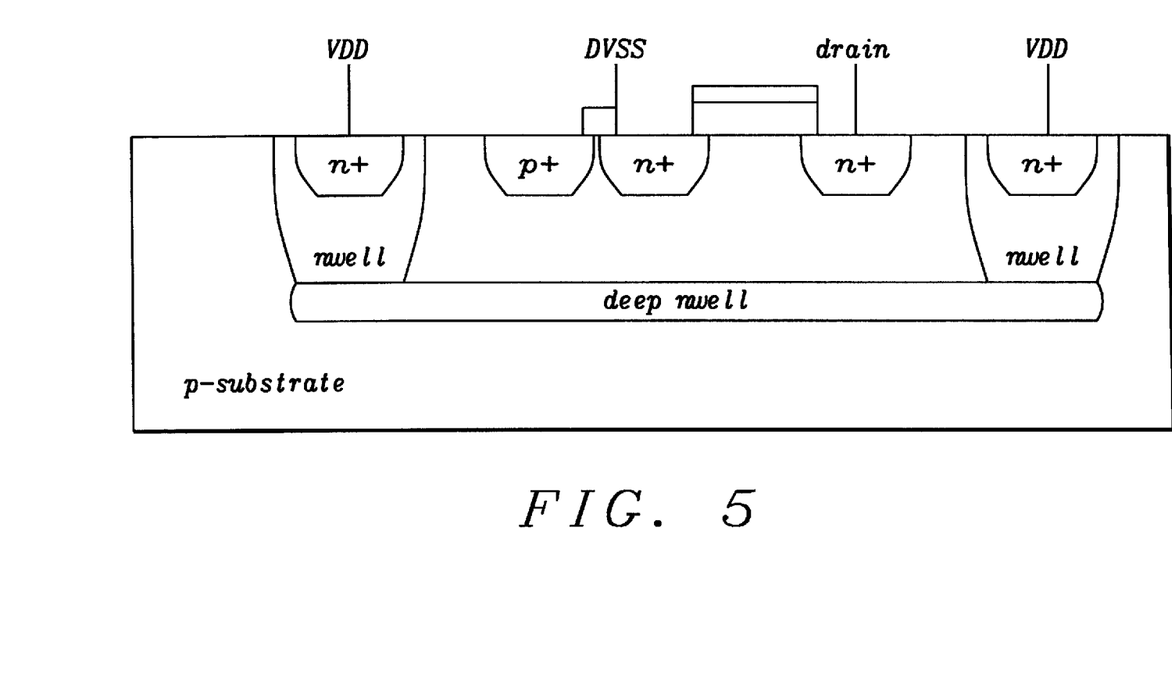
FIG. 5 shows an example of isolated NMOS transistors in a deep n-well on a p-substrate as utilized in the switching network of FIG. 4.

An example of the required switching network implemented in a triple-well P-substrate CMOS process is illustrated in FIG. 4. Vbias is provided such that the desired ISource current is supplied to the switching network. All NMOS devices are formed in local p-wells which sit in an isolating deep N-well such that latch-up risk is eliminated. An example of such isolated NMOS transistors in a deep n-well on a p-substrate is illustrated in FIG. 5. The circuit of FIG. 2 would not work properly without the use of a sophisticated switching network which allows the RMP_L and RMP_R nodes to rise and fall to positive and negative voltages with respect to the common ground.

Also the circuit disclosed only makes sense when a single capacitive element is used.

The switching network of FIG. 4 of the oscillator allows the RMP_L and RMP_R nodes to rise and fall between V+ and V− (as shown in FIG. 3), i.e. positive and negative potentials with respect to ground supply, without causing leakage to substrate or risk of latch-up, i.e. the inadvertent creation of a low-impedance path. The other requirement is that during φ1 the RMP_R node is connected to the current source 40 and isolated from all other current paths while the RMP_L node is connected to ground (vss in FIG. 4). Furthermore, during φ2 the RMP_L node is connected to the current source 40 and isolated from all other current paths while the RMP_R node is connected to ground (vss in FIG. 4). The example switching network in FIG. 4 does satisfy these requirements, although it would be possible to envisage a different switching network for this function.

In the circuit of FIG. 4 the current source transistor 40 and transistor switches 41, 42, 43 and 44 are PMOS transistors. Transistor switches 45, 46, 47, 48, 49, and 490 are NMOS switches with local p-wells isolated from the chip p-type substrate by an n-well (triple well process) as noted above. It should be noted that the circuit of FIG. 4 is using one current source 40 only.

It should be noted that in all illustrated examples, the bulk of any PMOS transistor can either be attached as shown, or can be attached to the positive supply, or any voltage higher than the positive supply.

In phase φ1 transistor switches 41, 44, 47, and 48 are closed. Transistor switches 42, 43, 45, and 490 are closed in phase φ2. The lines above φ1 or φ2 in FIGS. 4, and 6a-b refer to the polarity of the signal. Therefore φ1 always means that a transistor is closed in phase 1—if there is a line above the φ1 this means the voltage will be low during phase 1 (required to close a PMOS during phase 1), whereas if there is no line above the φ1 this means the voltage will be high during phase 1 (required to close an NMOS during phase 1).

Figure 6A:
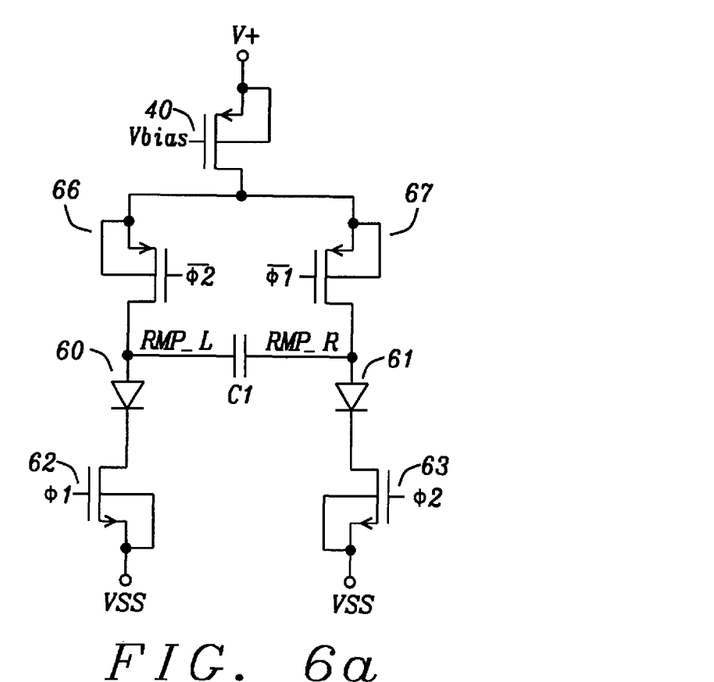
FIG. 6a shows a second embodiment of an oscillator (comparator and logic not shown) with a switching network also configured to enable low frequency clocks and smaller technology (<250 nm) due to lower supply voltage.
Figure 6B:
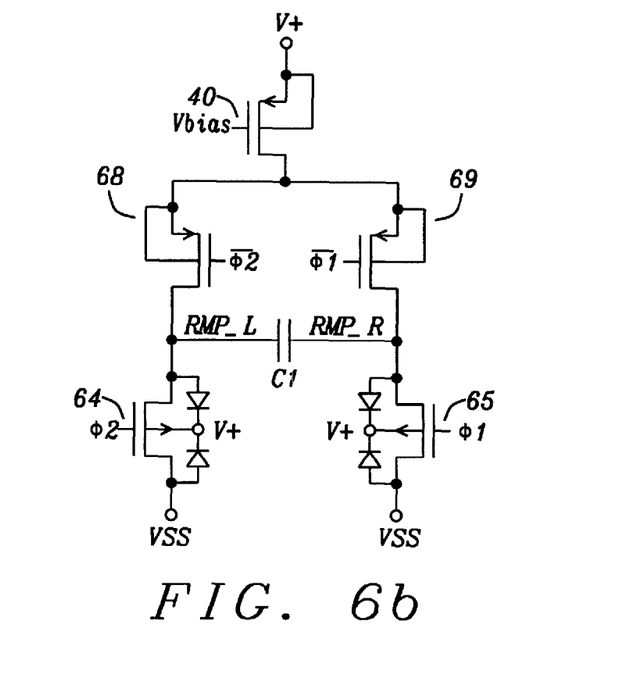
FIG. 6b shows a third embodiment of an oscillator (comparator and logic not shown) with a switching network also configured to enable low frequency clocks and smaller technology (<250 nm) due to lower supply voltage.

As noted above it would be possible to envisage a different switching network for the oscillators disclosed function. FIGS. 6a and 6b show switching networks both also configured to enable low frequency clocks and smaller technology (<250 nm) due to lower supply voltage. Both circuits of FIGS. 6a and 6b are using one current source 40 only and one capacitive element C1 only. The circuit of FIG. 6a has two diodes or other rectifying means 60 and 61.

In a preferred embodiment transistor switches 62 and 63 shown in FIG. 6a are NMOS switches having local p-wells isolated from the chip p-type substrate by an n-well (triple well process). It should be noted that the local p-wells may be advantageous in regard of performance but they are not essential to the design of the switching network disclosed. The bulk of NMOS transistor switches 62 and 63 may be each connected to their source or to their substrate. Transistor switches 66 and 67 shown in FIG. 6a are PMOS switches In FIG. 6a the 2 diodes 60 and 61 are used to ensure that significant current does not flow through the body diode of the transistors when RMP_L or RMP_R go negative with respect to VSS.

Transistor switches 64, 65, 68 and 69 shown in FIG. 6b are PMOS switches. PMOS transistor switches 64 and 65 may have local n-wells tied to the positive supply V+. Their bulks are connected to V+ (positive supply).

The diodes, illustrated with PMOS switches 64 and 65 are parasitic body diodes of the PMOS transistors 64 and 65 that are present in the CMOS process. They were intended/included to show that there is no current path opened when the RMP_L or RMP_R nodes go negative.

These PMOS switches 64 and 65 cannot be turned on as efficiently as NMOS transistors (they can only pull RMP_L and RMP_R nodes down to a threshold voltage Vt above VSS) but they guarantee no significant current path through their body diodes when RMP_L or RMP_R nodes go negative with respect to VSS.

It should be noted that in in FIG. 6b, the bulk of any PMOS transistor can either be attached as shown, or can be attached to the positive supply, or any voltage higher than the positive supply.

Similar to the circuit shown in FIG. 2 is that in the circuits 6a and 6b during first phase φ1 the RMP_R node is connected to the current source and isolated from all other current paths while the RMP_L node is connected to ground (vss in FIG. 4). Furthermore, during φ2 the RMP_L node is connected to the current source 1 and isolated from all other current paths while the RMP_R node is connected to ground (vss in FIG. 4).

It should be noted that other similar switching networks than shown in FIGS. 4 and 6a-6b are conceivable.

Summarizing it should be noted that the oscillators illustrated in FIGS. 2, 6a and 6b achieve, compared to the circuit shown in FIG. 1, a significant reduction in silicon area of capacitive elements, an improved duty-cycle is superior in regard of implementing lower frequency clocks, and is particularly useful for smaller technology nodes (<250 nm) due to lower supply voltage.

Furthermore the switching networks of the oscillators illustrated in FIGS. 4, 6a and 6b implement a principle of allowing ends of the single capacitor to go temporarily below ground supply. Moreover it should be noted that all components of the oscillators illustrated in FIGS. 4, 6a and 6b may be integrated in one chip.

The oscillators illustrated in FIGS. 2, 6a and 6b could be used e.g. for a low frequency oscillator, i.e. low-power mode chip operation, running digital with very slow backup clock to allow shutting down main high-frequency oscillator; or replacing high accuracy quartz oscillator signal in case of external clock supply being removed and main chip still requiring good accuracy clock—possibly 32,768 Hz.

Figure 7:
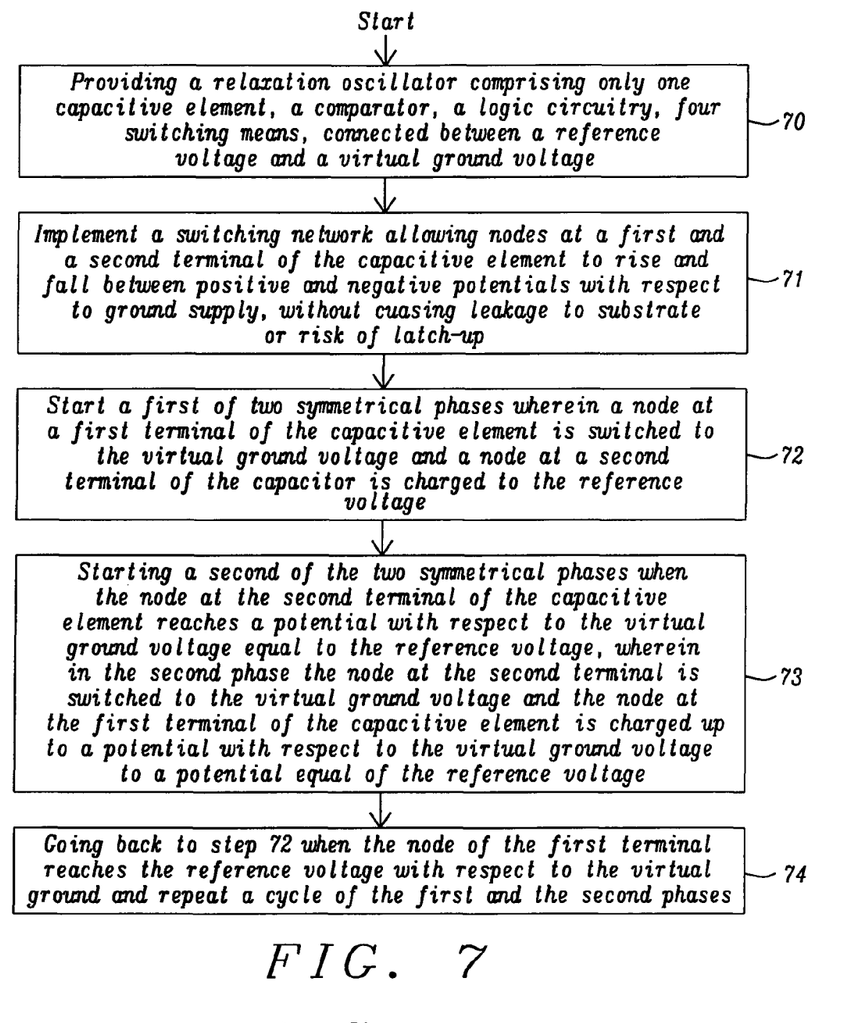
FIG. 7 illustrates a flowchart of a method to achieve oscillators requiring minimal silicon area and enabled to operate at low frequencies and for small technology nodes.

FIG. 7 illustrates a flowchart of a method to achieve oscillators requiring minimal silicon area and enabled to operate at low frequencies and for small technology nodes. A first step 70 describes the provision of a relaxation oscillator comprising only one capacitive element, a comparator, a logic circuitry, four switching means, connected between a reference voltage and a virtual ground voltage. Step 71 illustrates implementing a switching network allowing nodes at a first and a second terminal of the capacitive element to rise and fall between positive and negative potentials with respect to ground supply, without causing leakage to substrate or risk of latch-up. Step 72 shows starting a first of two symmetrical phases wherein a node at a first terminal of the capacitive element is switched to the virtual ground voltage and a node at a second terminal of the capacitive element is charged to the reference voltage. Step 73 depicts starting a second of the two symmetrical phases when the node at the second terminal of the capacitive element reaches a potential with respect to the virtual ground voltage equal to the reference voltage, wherein in the second phase the node at the second terminal is switched to the virtual ground voltage and the node at the first terminal of the capacitive element is charged up to a potential with respect to the virtual ground voltage to a potential equal of the reference voltage. Step 74 discloses going back to step 72 when the node of the first terminal reaches the reference voltage with respect to the virtual ground and repeat a cycle of the first and the second phases.

While the invention has been particularly shown and described with reference to the preferred embodiments thereof, it will be understood by those skilled in the art that various changes in form and details may be made without departing from the spirit and scope of the invention.

What is claimed is:

1. A method to achieve CMOS oscillators enabled for small technology nodes below 250 nm comprising the steps of
   (1) providing a relaxation oscillator comprising only one capacitive element, a current source configured to providing current for charging the capacitive element, a comparator, a logic circuitry, and a CMOS switching network, configured to alternatingly charging one terminal of the capacitive element up to a level of a reference level and connecting another terminal of the capacitive element to VSS voltage;
   (2) implementing the CMOS switching network built by a triple-well P-substrate CMOS process preventing any leakage to substrate, allowing nodes at a first and a second terminal of the capacitive element to rise and fall alternatingly between the reference voltage and VSS voltage;
   (3) eliminating latch-up risks by forming all NMOS devices in local p-wells which sit in an isolating deep N-well;
   (4) starting a first of two symmetrical phases wherein a node at a first terminal of the capacitive element is switched to VSS voltage and a node at a second terminal of the capacitive element is charged to the reference voltage;
   (5) starting a second of the two symmetrical phases when the node at the second terminal of the capacitive element reaches a potential equal to the reference voltage, wherein in the second phase the node at the second terminal is switched to VSS voltage and the node at the first terminal of the capacitive element is charged up to a potential equal of the reference voltage; and
   (6) going back to step (3) when the node of the first terminal reaches the reference voltage and repeat a cycle of the first and the second phases.

2. The method of claim 1 wherein a voltage threshold detector switches if an end of the first or the second phase is reached and a logic circuitry is triggered to swap between the two phases.

3. The method of claim 1 wherein a voltage threshold detector detects when one of the nodes at the terminals of the capacitive elements exceeds the reference voltage.

4. The method of claim 1 wherein a frequency f of the oscillator is determined by $$f = \frac{I}{4 \times C \times V}$$

wherein I is a charging current, C is the total capacitance of the single capacitive element, and V is a voltage at which the capacitive element is considered to be fully charged.

5. The method of claim 1 wherein at a time immediately before the start of phase one the potential between both nodes equals a difference between the reference voltage and VSS voltage and at the start of phase one the node of the first terminal is switched to VSS voltage and the charge stored in the capacitive element remains, therefore the potential between the node at the second terminal and VSS voltage equals the difference between the reference voltage and VSS voltage.

6. The method of claim 1 wherein the switching network is implemented using NMOS switches, wherein two diodes ensure that no significant current flows through a drain-body diode of the NMOS switches when one of the nodes of the capacitive element has a negative potential respect to VSS.

7. The method of claim 1 wherein the switching network is implemented using PMOS switches.

8. The method of claim 1 wherein during the first phase the node at the second terminal is connected to the current source and isolated from all other current paths while the node at the first terminal is connected to VSS voltage.

9. The method of claim 1 wherein during the second phase the node at the first terminal is connected to the current source and isolated from all other current paths while the node at the second terminal is connected to VSS voltage.

10. The method of claim 1 wherein the switching network is implemented in a triple-well P-substrate CMOS process comprising NMOS switches with local p-wells isolated from the chip p-type substrate by an n-well.

11. The method of claim 1 wherein the capacitive element is formed by parallel metal plates separated by a dielectric layer of predetermined thickness.

12. The method of claim 11 wherein the capacitive element is a Metal-insulator-Metal (MIM) capacitor.

13. The method of claim 11 wherein the capacitive element is a Metal-Oxide-Metal capacitor.

14. The method of claim 1 wherein the capacitive element is an external capacitor.

15. The method of claim 1 wherein the nodes at the first and the second terminal of the capacitive element are allowed to rise and fall between positive and negative potentials with respect to VSS voltage.

16. A CMOS relaxation oscillator enabled for small technology nodes below 250 nm, comprising:
   one capacitive element only;
   one current source only wherein a first terminal is connected to VDD voltage and a second terminal is connected to a switching network;
   a threshold detection unit capable of determining when a node of the capacitive element exceeds a given threshold voltage;
   a logic circuitry configured to be triggered by the voltage threshold detector to swap between two operation phases; and
   the switching network capable of alternating between two phases of operation comprising a number of CMOS switches, wherein the switching network is configured to operate the oscillator in the two phases, where in a first phase a node at a first terminal of the capacitive element is switched to VSS voltage and a node at a second terminal of the capacitive element is charged to a reference voltage, and in a second phase, when the node at the second terminal of the capacitive element reaches a potential equal to the reference voltage, the node at the second terminal is switched to the VSS voltage and the node at the first terminal of the capacitive element is charged up to a potential equal of the reference voltage, wherein the switching network is implemented in a triple well P-substrate CMOS process thus preventing any leakage to substrate.

17. The oscillator of claim 16 wherein all components of the oscillator are integrated on one chip.

18. The oscillator of claim 16 wherein the switching network is also configured to allow the nodes of both terminals to rise and fall alternatingly between positive and negative potentials with respect to VSS voltage.

19. The oscillator of claim 16 wherein the switch network comprises:
- a first PMOS transistor switch of a number of PMOS transistor switches, wherein a source is connected to VDD voltage, a gate is controlled by the logic circuitry, and a drain is connected to a drain of a first NMOS transistor switch of a number of NMOS transistor switches and to a gate of a second NMOS transistor switch, wherein a bulk is connected the source, to VDD voltage or to a voltage higher than VDD voltage;
- the first NMOS transistor switch, wherein a gate is controlled by the logic circuitry, a source is connected to the node of the first terminal of the capacitive element, to a drain of a second PMOS transistor switch, to a bulk and to a source of the second NMOS transistor switch;
- the second NMOS transistor switch wherein a drain is connected to a drain of a third NMOS transistor switch:
- the third NMOS transistor switch, wherein a gate is controlled by the logic circuitry and a source is connected to a bulk and to VSS voltage;
- the second PMOS transistor switch, wherein a gate is controlled by the logic circuitry a source is connected to a bulk, to the second terminal of the current source and to a source of a third PMOS transistor switch, wherein a bulk is connected to the source, to VDD voltage or to a voltage higher than VDD voltage;
- the third PMOS transistor switch, wherein a gate is controlled by the logic circuitry and a drain is connected to a node of the second terminal of the capacitive element and a bulk is connected to the source, to VDD voltage or to a voltage higher than VDD voltage;
- a fourth PMOS transistor switch, wherein a source is connected to VDD voltage, a gate is controlled by the logic circuitry, and a drain is connected to a drain of fourth NMOS transistor switch and to a gate of a fifth NMOS transistor switch, wherein a bulk is connected to the source, to VDD voltage or to a voltage higher than VDD voltage;
- the fourth NMOS transistor switch, wherein a gate is controlled by the logic circuitry, a source is connected to the node of the second terminal of the capacitive element, to a drain of the third PMOS transistor switch, to a bulk and to a source of a fifth NMOS transistor switch;
- the fifth NMOS transistor switch wherein a drain is connected to a drain of a sixth NMOS transistor switch; and
- the sixth NMOS transistor switch, wherein a gate is controlled by the logic circuitry and a source is connected to a bulk and to VSS voltage.

20. The oscillator of claim 16 wherein the switch network comprises:
- a first PMOS transistor switch of a number of PMOS transistors switches, wherein a gate is controlled by the logic circuitry, a source is connected to the second terminal of the current source, and to a source of a second PMOS transistor switch, and a drain is connected to the node of the first terminal of the capacitive element and to an anode of a first rectifying means, wherein a bulk is connected the source, to VDD voltage or to a voltage higher than VDD voltage;
- the first rectifying means wherein a cathode is connected to a drain of a first NMOS transistor switch of a number of NMOS transistor switches;
- the first NMOS transistor switch, wherein a gate is controlled by the logic circuitry, a source is connected to VSS voltage, and a bulk is connected to the source or to a substrate;
- the second PMOS transistor switch, wherein a gate is controlled by the logic circuitry, the source is connected to a bulk, a drain is connected to the node of the second terminal of the current source, and to an anode of a second rectifying means;
- the second rectifying means wherein a cathode is connected to a drain of a second NMOS transistor switch; and
- the second NMOS transistor switch, wherein a gate is controlled by the logic circuitry, a source is connected VSS voltage, and a bulk is connected to the source or to a substrate.

21. The oscillator of claim 20 wherein said rectifying means are diodes.

22. The oscillator of claim 16 wherein the switch network comprises:
- a first PMOS transistor switch of a number of PMOS transistors switches, wherein a gate is controlled by the logic circuitry, a source is connected to the second terminal of the current source, and to a source of a second PMOS transistor switch, and a drain is connected to the node of the first terminal of the capacitive element, and to the first terminal of a second PMOS transistor switch, wherein a bulk is connected the source, to VDD voltage or to a voltage higher than VDD voltage;
- the second PMOS transistor switch, wherein a gate is controlled by the logic circuitry, a source is connected to the second terminal of the current source, and to a source of the first PMOS transistor switch, and a drain is connected to the node of the second terminal of the capacitive element, and to the first terminal of a third PMOS transistor switch, wherein a bulk is connected the source, to VDD voltage, or to a voltage higher than VDD voltage;
- the third PMOS transistor switch, wherein a first terminal is connected to the drain of the first PMOS transistor switch, a second terminal is connected to VSS voltage, a gate is controlled by the logic circuitry, and the bulk is connected to VDD voltage, or to a voltage higher than VDD voltage;
- the fourth PMOS transistor switch, wherein a first terminal is connected to the drain of the second PMOS transistor switch, a second terminal is connected to switch voltage, a gate is controlled by the logic circuitry, and the bulk is connected to VDD voltage, or to a voltage higher than VDD voltage.

23. The oscillator of claim 16 wherein said CMOS switches comprise NMOS switches, wherein all NMOS switches are formed in local p-wells, which sit in an isolating deep N-well in order to eliminate latch-up.

24. The oscillator of claim 16 wherein a frequency f of the oscillator is determined by $$f = \frac{I}{4 x C x V}$$

wherein I is a charging current, C is the total capacitance of the single capacitive element, and V is a voltage at which the capacitive element is considered to be fully charged.

* * * * *